United States Patent
Martin

(10) Patent No.: US 8,675,810 B2
(45) Date of Patent: Mar. 18, 2014

(54) PROGRAMMABLE LOW POWER MULTI-MODULUS DIVIDER WITH 50/50 DUTY CYCLE

(75) Inventor: Alan J. Martin, Plymouth (GB)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/538,195

(22) Filed: Jun. 29, 2012

(65) Prior Publication Data

US 2014/0003569 A1    Jan. 2, 2014

(51) Int. Cl.
*H03K 21/00* (2006.01)
*H03K 23/00* (2006.01)

(52) U.S. Cl.
USPC .............................. 377/47; 377/48

(58) Field of Classification Search
None
See application file for complete search history.

(56) References Cited

U.S. PATENT DOCUMENTS

| | | | | |
|---|---|---|---|---|
| 5,172,400 A * | 12/1992 | Maemura | | 377/116 |
| 6,404,839 B1 * | 6/2002 | Fong et al. | | 377/47 |
| 6,566,908 B2 * | 5/2003 | Mack | | 326/63 |
| 7,170,965 B2 * | 1/2007 | Chien | | 375/376 |
| 7,924,069 B2 * | 4/2011 | Narathong et al. | | 327/117 |
| 8,406,371 B1 * | 3/2013 | Barale et al. | | 377/47 |
| 2007/0147571 A1 * | 6/2007 | Yu et al. | | 377/47 |

* cited by examiner

*Primary Examiner* — Tuan T Lam
(74) *Attorney, Agent, or Firm* — Ellis B. Ramirez; Prass LLP

(57) ABSTRACT

Disclosed is a method and apparatus for a modular high performance low power divider with 50/50 duty cycle output. The modularity offers custom dividers to be quickly developed while maintaining minimum power usage. A multi-modulus divider (MMD) receives an input signal and outputs an MMD output signal. The MMD includes a chain of modulus divider stages in such a way as to generate any divide value from 1 to 2(n+1)-1 (n is the number of cascaded elements) while maintaining a 50/50 duty cycle output. Power can be dramatically reduced as the frequency of each subsequent element is halved. The modular nature allows rapid development of any dividers simply by adding more elements to the chain.

18 Claims, 8 Drawing Sheets

PROGRAMMABLE LOW POWER MULTI-MODULUS DIVIDER WITH 50/50 DUTY CYCLE

BACKGROUND

1. Field of the Disclosed Embodiments

The present invention relates generally to digital circuits and more particularly to programmable multi-modulus dividers.

2. Introduction

Digital frequency dividers are used in computer and communications circuits such as receiver and transmitter circuitry within a cellular telephone to synthesize various utility clocks from a reference oscillator. A digital frequency divider takes a clock signal "VCO" as the input, and outputs a new clock signal "$V_{TDC}$". The frequency of $V_{TDC}$ is the frequency of VCO divided by an integer. Such dividers can be implemented in logic as fixed divisor divide-by-n, or programmable divisor divide-by-m.

A type of divider referred to here a "multi-modulus divider" (MMD) is often used to realize the frequency divider. The MMD receives the high frequency input signal and divides it by a divisor value (DV) to generate the frequency output signal. The MMD includes a plurality of modulus divider stages (MDS) that are cascaded together to form the MMD. Each MDS (except the last MDS) receives a feedback modulus control signal from the next MDS in the chain. Each MDS also receives a modulus divisor control signal. However, cascaded MDS introduce an amount of jitter at each stage that the noise requirement imposed on the MMD by some communication standard cannot be satisfied.

Solutions to the jitter problem have introduce other worries and problems such as relatively high power consumption, as all latches within a counter tend to be all clocked at the highest input frequency. They can also tend to not cover every possible divide value such as high prime numbers, and can be lengthy to design.

SOME EXAMPLE EMBODIMENTS

Therefore, there is a need for a modular high performance low power divider with 50/50 duty cycle output. The modularity offers custom dividers to be quickly developed while maintaining minimum power usage. A multi-modulus divider (MMD) receives an input signal and outputs an MMD output signal. The MMD includes a chain of modulus divider stages in such a way as to generate any divide value from 1 to 2(n+1)−1 (n is the number of cascaded elements) while maintaining a 50/50 duty cycle output. Each stage receives an input signal, divides it by either two or three, and outputs the result as an output signal. Power can be dramatically reduced as the frequency of each subsequent element is halved. The modular nature allows rapid development of any dividers simply by adding more elements to the chain.

According to one embodiment, a multi-modulus divider (MMD) comprising a chain of divide elements to generate a modulus control output synchronously with a clock signal in response to a modulus control input and a programming signal (fon), the chain of divide elements having a plurality of states corresponding to a 2/3 divider; and a duty cycle logic to generate the programming signal (fon) to the divide element in response to a programming word (ip,Pn) for a frequency divider; wherein the chain of divide elements are configurable as an N-stage or M-stage multi-modulus divider that divides an input signal and generates a frequency divider output signal.

According to another embodiment, a method comprising using a chain of divide elements to generate a modulus control output synchronously with a clock signal in response to a modulus control input and a programming signal (fon), the chain of divide elements having a plurality of states corresponding to a 2/3 divider; and using a duty cycle logic to generate the programming signal (fon) to the divide element in response to a programming word (ip,Pn) for a frequency divider; wherein the chain of divide elements are configurable as an N-stage or M-stage multi-modulus divider that divides an input signal and generates a frequency divider output signal.

According to yet another embodiment, a multi-modulus divider (MMD) comprising a chain of divide elements to generate a modulus control output synchronously with a clock signal in response to a modulus control input and a programming signal (fon), the chain of divide elements having a plurality of states corresponding to a 2/3 divider; a duty cycle logic to generate the programming signal (fon) to the divide element in response to a programming word (ip,Pn) for a frequency divider; and a decode logic at each divide element to trigger storage latches in the decode logic to a wait state in response to a divide value, wherein a storage latch stores the programming word (ip,Pn) for that divide element; wherein the chain of divide elements are configurable as an N-stage or M-stage multi-modulus divider that divides an input signal and generates a frequency divider output signal.

Exemplary embodiments are described herein. It is envisioned, however, that any system that incorporates features of any apparatus, method and/or system described herein are encompassed by the scope and spirit of the exemplary embodiments.

DETAILED DESCRIPTION OF THE DISCLOSED EMBODIMENTS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
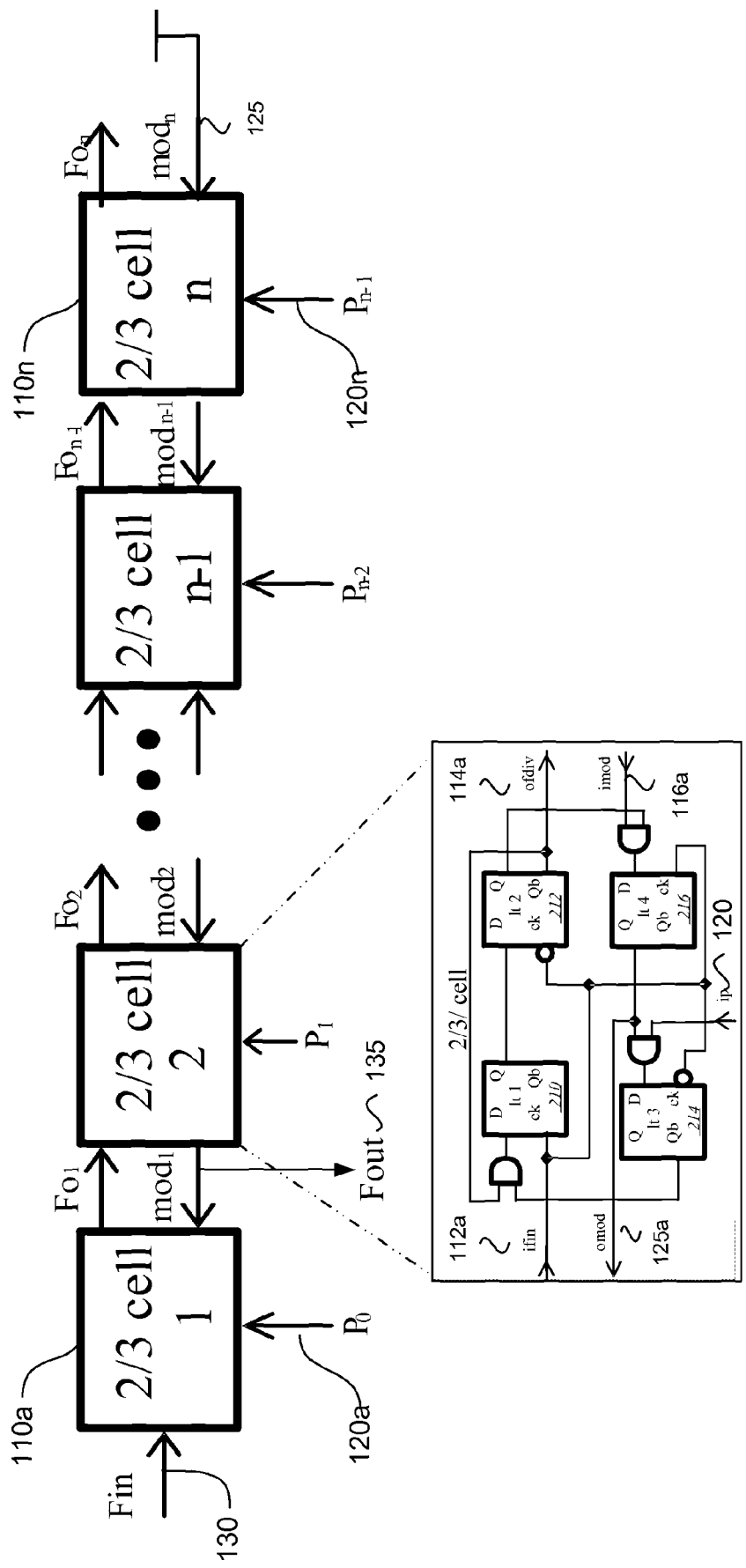
FIG. 1 illustrates a block diagram of a cascaded 2/3 divider configuration and original 2/3 divider element.

Additional features and advantages of the disclosure will be set forth in the description which follows, and in part will be obvious from the description, or may be learned by practice of the disclosure. The features and advantages of the disclosure may be realized and obtained by means of the instruments and combinations particularly pointed out in the appended claims. These and other features of the present disclosure will become more fully apparent from the following description and appended claims, or may be learned by the practice of the disclosure as set forth herein.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Although embodiments of the invention are not limited in this regard, discussions utilizing terms such as, for example, "processing," "computing," "calculating," "determining," "applying," "receiving," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of resistors" may include two or more resistors.

The term "controller" is used herein generally to describe various apparatus relating to the operation of one or more device that directs or regulates a process or machine. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter. A high performance low power modular programmable divider with 50/50 duty cycle output is presented. The modularity offers custom dividers to be quickly developed while maintaining minimum power usage.

FIG. 1 illustrates a block diagram of a cascaded 2/3 divider configuration and original 2/3 divider element. A high performance low power modular programmable divider with 50/50 duty cycle output is presented. The modular programmable divider divides the frequency divider input signal $F_{in}$ on input node 130 by a divisor value (DV) in a count cycle and generates the frequency divider output signal $F_{OUT}$ on output node 135. The illustrated multi-modulus divider (MMD) node 135. The illustrated multi-modulus divider (MMD) shows a conventional architecture built around cascaded 2/3 pre-scalar blocks (110a through 110n) where upstream divide elements operate at higher clock frequencies then downstream divide elements (N, N−1, N−2, . . . ). In FIG. 1, the N divide elements or modulus divider stages are designated 1 through N. The output signals output by the N divide elements are designated $F_{O1}$ through $F_{ON}$, respectively. Each divide element can divide by either two or by three depending on the values of a modulus divisor control signal $P_0$ through $P_N$ and a feedback modulus control signal $Mod_N$ . . . $Mod_1$. The divisor value DV that the overall MMD divides by is determined by the values of the modulus divisor control signals.

An individual 2/3 cell element is shown in detail. Each 2/3 cell element comprises level sensitive latches (210, 212, 214, 216) and logic gates. The divide by 2/3 element divides the input frequency by 2 or 3 depending on the inputs imod 116a and ip 120. Normally, the output period is twice that of the input unless imod 116a equals 1 (=1) and ip 120 is also one (ip=1), for which the ofdiv 114a period is three times the input time period. The other output signal omod 125a has the same time period as ofdiv 114a (only when imod 116a equals 1), but with a different duty cycle. When connected in a cascade chain as shown in FIG. 1, the last cell always has its imod 116a input as logic high, and for all other cells, the imod input is high for only one input cycle during one output cycle, adding an extra input cycle to the output.

The programmable divider operates as follows. Once in a division period, the last cell on the chain generates the signal $mod_{n-1}$ 125. This signal then propagates "up" the chain (UPSTREAM), being re-clocked by each cell along the way. An active mod signal (116a) enables a cell to divide by 3 (once in a division cycle), provided that its programming input ip 120 is set to 1. Division by 3 adds one extra period of each cell's input clock ifin 112a to the period of the output signal. Hence, a chain of 2/3 cells provides an output signal with a period of:

$$T_{out} = 2^n \cdot T_{in} + 2^{n-1} \cdot T_{in} \cdot P_{n-1} + 2^{n-2} \cdot T_{in} \cdot P_{n-2} + \ldots + 2 \cdot T_{in} \cdot P_1 + T_{in} \cdot P_0$$

$$T_{out} = T_{in} \cdot (2^n + 2^{n-1} \cdot P_{n-1} + 2^{n-2} \cdot P_{n-2} + \ldots + 2 \cdot P_1 + P_0) = T_{in} \cdot (2^n + \text{binary weighted divide code } \{P_{n-1} - P_0\})$$

Here $T_{in}$ is the period of the input signal Fin 130, and $P_0, \ldots, P_{n-1}$ are the binary programming values (120a . . . 120n) of the cells 1 to n respectively. The equation shows that all integer division ratios ranging from $2^n$ (if all=0) to $(2^{(n+1)}-1)$ (if all=1) can be realized. This original structure generated a limited programming divide range of ($2^n$) to $(2^{(n+1)}-1)$ i.e. with 4 elements (n=4) a limited programmable range of 16-31 can be achieved. A modification of the input signals (imod 116a), i.e., at elements N−1 and N−2, which comprises OR gates and in doing so decoupled the minimum divide value from the maximum.

Figure 2:
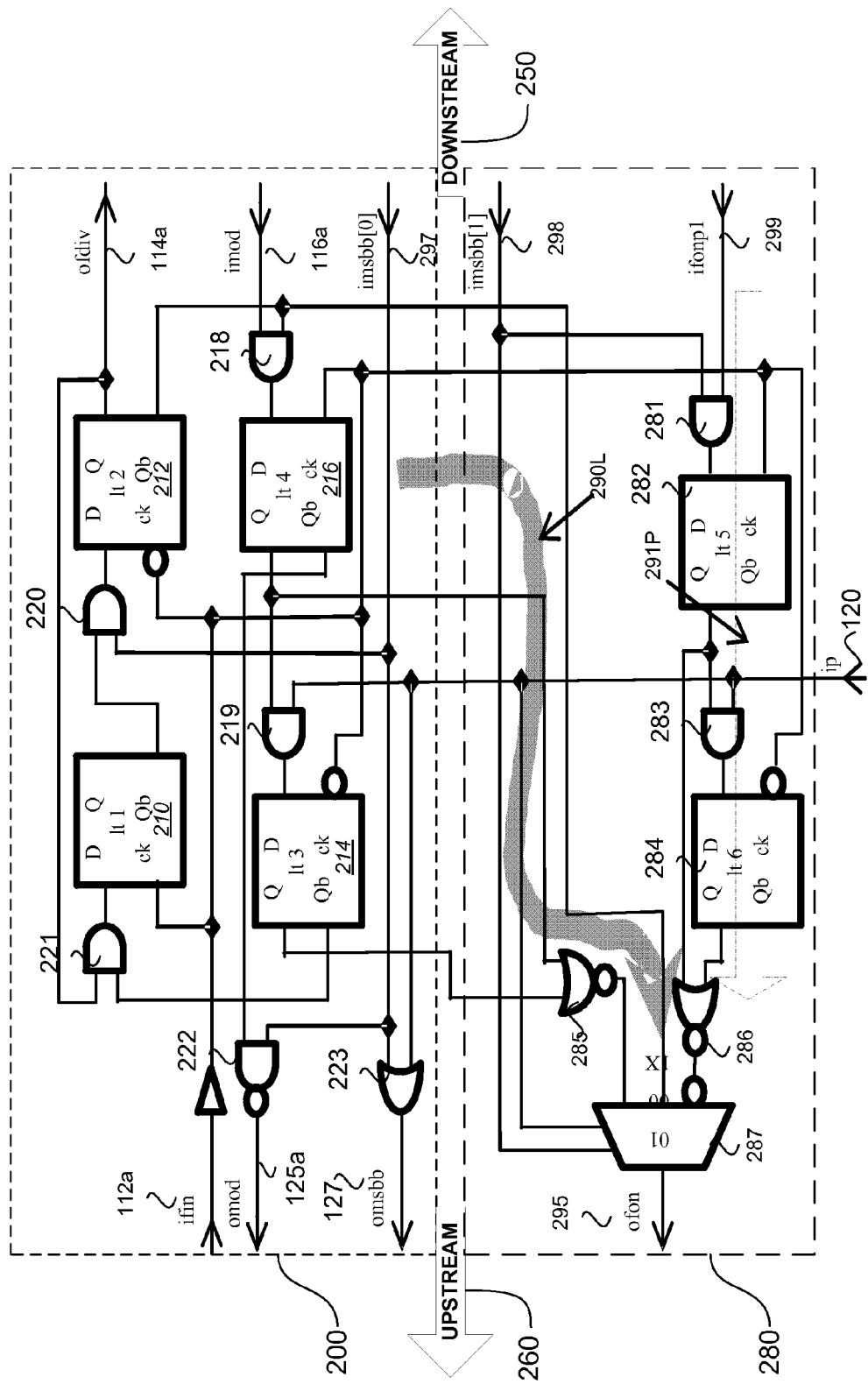
FIG. 2 illustrates a block diagram of a modified 2/3 element with 50/50 duty cycle logic in accordance to an embodiment.

FIG. 2 illustrates a block diagram of a modified 2/3 element with 50/50 duty cycle logic in accordance to an embodiment. The circuit for 2/3 cell with the extra minimum divide OR gates (222,223) incorporated can be seen below. The ofdiv 114a output changes on the falling edge of ifin 112a and because ofdiv 114a becomes the ifin 112a of the next 2/3 downstream, the imod 116a input will also change following a falling edge of the ifin 112a. The imod 116a signal is captured on the rising edge of ifin 112a and if ip 120 is high extends the ofdiv 114*a* by one ifin 112*a* period. The addition of the imsbb[ ]297 and omsbb [ ] 298 allow the propagation of the identity of the most significant active element to be identified. The addition of AND gate 220 on the D input of lt2 212 stops this element from generating a clock to be passed downstream if this element is below the most significant active element, and as such can save more power when smaller divide values are required. This also results in all latches having a common AND gate 220 on their D input such as shown on latch 212, and so if within an element a common clock (clk) and clockb (clkb) is used a common "and/latch", such as AND gate 220 and latch 212, sub_block can be used four (4) times. The divider element has common AND gates 218, 219, 221 associated with four latches 210, 212, 214, and 216. The final omod 125*a* signal has the correct divide value but does not have an even mark space ratio, many application require a 50/50 duty cycle so additional circuitry (duty logic 280) is included in the design to achieve the mark space ratio or a 50/50 duty cycle.

To achieve a 50/50 mark space ratio output an additional fon 295 return path similar to the active mod signal (omod 125*a*) one can be used, that is re-timed per element and either maintains its length or extends it by half a local ifin 112*a* period if the local ip 120 input is high. The additional fon 295 can be used as programming signal to select the composition of the multi-modulus divider (MMD). Within the chain of divider elements there are times when the ifin 112*a* may not be an even mark-space because of the way the mod signal (omod 125*a*) can modulate the ofdiv 114*a* signals as it propagates upstream, if these variable length ifin 112*a* clock pulses are not avoided when generating the fon 295 signal the 50/50 duty cycle output will not be maintained. This avoidance can be achieved by the highest order active element in the chain which initiates both the Fon 295 signal path and the active mod signal (omod 125*a*) path and can position these signals relative to each other in such a way as to avoid interaction as they propagate upstream 260. However an element needs to be aware of its relative status within the chain to either propagate the Fon 295 signal or initialize it. This is achieved by passing the imsbb input 297 and 298 from the preceding downstream element 250.

The duty cycle logic 280 of the 2/3 element with the 50/50 fon 295 shows the two (2) possible paths to generate the ofon 295 signal, the locally initialized fon path 290L via combinatorial logic in the 2/3 pre-scalar logic block, this path only becomes active if this element is the msb (most significant bit) active one in the programmable divider code (determined by the imsbb[1, 0]=01), the length of the initial fon pulse is either 1 or 1.5 ifin 112*a* periods (determined by the ip 120 input 0=1 period, 1=1.5 periods). The combinatorial logic for a locally initialized fon path 290L comprises NOR gate 285 and multiplexer 287 Care is taken to ensure that possible extended ifin 112*a* clocks generated during the propagation of the mod pulse are avoided to ensure the 50/50 period is maintained. The other possible path for the ofon generation is the propagated re-timed one 291P, this captures the ifonp1 299 signal from the downstream element and re-times it to the local ifin 112*a* clock, and it also optionally extends it by half an ifin 112*a* period if the ip 120 input is high. The two new AND (AND gate 281 and AND gate 283) and latch elements (Latch it6 284 and Latch it5 282) can also re-use the same common sub-block as used in the counter above. Also note that the generation of the omod 125*a* output is now from NAND gate 222, this removed an inverter from its path.

It should be noted that if the propagated re-timed fon path 291P is used the ofon 295 output rising edge will be synchronized to the rising edge of the ifin 112*a* clock. The combinatorial logic for a propagated path 291P comprises gates 281, 283, and 286 and latches 282 and 284. However with the locally initialized fon path 290L the ofon 295 rising edge will be synchronized to the falling edge of ifin 112*a* clock. The avoidance of extended ifin 112*a* clock periods to maintain 50/50 mark space ratio forces this inconsistency in ofon/ifin edge synchronization, however as long as there is another re-timing element upstream that is working at twice the clock rate of this element this inconsistency is corrected by it.

Figure 3:
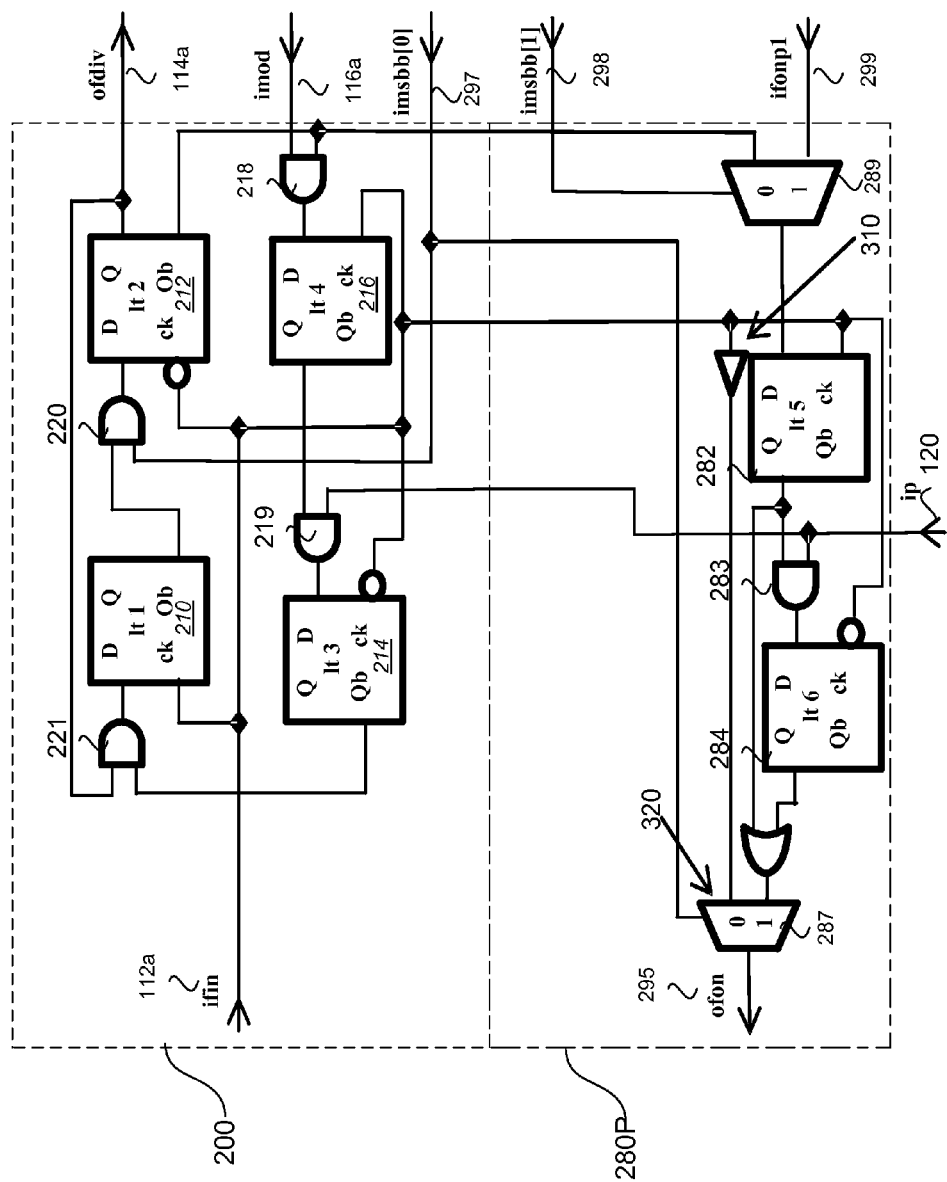
FIG. 3 illustrates a block diagram of a modified 2/3 element with 50/50 duty cycle logic and divide by 1 option in accordance to an embodiment.

FIG. 3 illustrates a block diagram 300 of a modified 2/3 element with 50/50 duty cycle logic and divide by 1 option in accordance to an embodiment. FIG. 3 addresses the instance when the divide element 200 is not the MSB cell but the least significant bit (lsb) element 280P, this blocks clock is the divider primary Fin clock and as such does not contain any extended periods, and so a slightly modified version of the 2/3 cell can be used for the lsb bit. Having a different lsb 2/3 element cell also allows a modification to handle a pass through mode, essentially a divide by one (1) mode; it also provides the opportunity to remove redundant outputs that would normally be passed upstream.

The function of Multiplexer 287 is a divide by one (1) option 320 and either a divide code of 0 or 1 sets the divider into a divide of 1 as selected by signal imsbb [0] 297, this is to ensure that in the event of a glitch during a divide load that results in an erroneous code of 0, the divider will not stop, the divider can be setup to re-initialize itself on a ofout rising edge ($F_{out}$ 135) which is the normal divider "ofout" signal, and the resulting erroneous divide of 1 resulting from a glitch to a divide of 0 will be cleared. In order to stop the divider the iresetb 610 input should be lowered.

Figure 4:
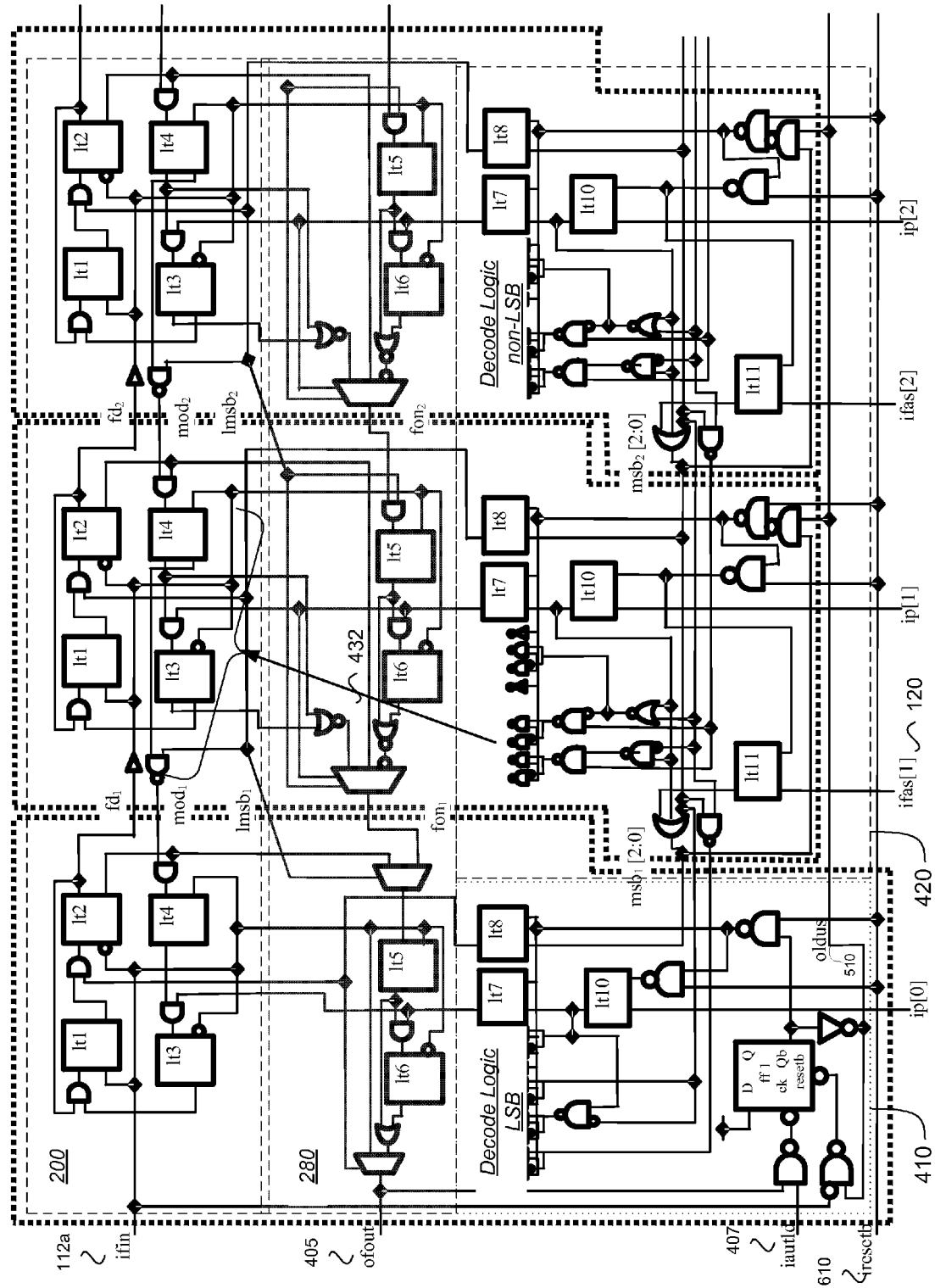
FIG. 4 illustrates a multi-modulus divider (MMD) with divide code loading or initialization logic in accordance to an embodiment.

In this circuit the multiplexer 287 used to select either the local 290L or propagated fon path (291P; which is routed through ifonp1 299, Mux 289, latch 284, AND gate 283) is before the re-timing/optional half ifin 112*a* period addition block, this ensures that the final ofon 295 rising edge is always synchronized to the rising edge if the input clock ifin 112*a*. The falling edge of ofon 295 will be synchronized to either edge of the ifin 112*a* clock (dependent on the P0 value 120*a*.). These new 2/3 pre-scalar blocks can then be cascaded together to generate any programmable divider as shown below in FIG. 4 and FIG. 8. Buffer 310 in ifin 112*a* path to match delay for latch 282 (lt5) clock (ck) to ofon 295 to minimize initial div by 1 high pulse width and ip 120 setup time issues FIG. 4 illustrates a multi-modulus divider (MMD) with divide code loading or initialization logic in accordance to an embodiment. The multi-modulus divider is shown with a plurality of chain of divide elements (120*a* . . . 120*n*) all having a common "AND"/Latch arrangement as illustrated in FIG. 2 collectively shown here as 200. The first element is shown receiving the ifin 112*a* input and ofout 405 as an output. Additionally the 2/3 elements are shown paired with the duty cycle logic 280. These dividers work well for fix divide values but can generate in-consistent behavior when switching between divide values that straddle a 2n value (for example 14 to 17) which could be the case in say a fractional narrowband phase lock loop (NPLL). The problem comes from the effective length of the chain dynamically changing as a function of the wanted divide value, the pulse propagation nature of the circuit, and the fact that different elements/latches can be in different states when the re-programming occurs. To overcome this limitation the ofout 405 signal can be inverted and used to generate a new ldus (FIG. 4 the signal oldus 510 and FIG. 5) load signal which can trigger a "reset" (or "set") of latches in each element to ensure they are in the correct state (initialized) to allow consistent behavior (synchronized) when changing wanted divide codes. To stop the divider the resetb 610 pin should be held low. The generation of the local element reset pulses can be done via ofout 405. If iautld 407 is high then a rising edge on ofout 406 will initialize thee pulse, which will be reset on the next falling edge of ifin 112a. Two circuits are included for initialization and synchronization of divider value. The decode logic circuit 410 is for handling the synchronization and initialization of the LSB element. The decode logic circuit 420 are for handling the synchronization and initialization of non-lsb elements.

Figure 5:
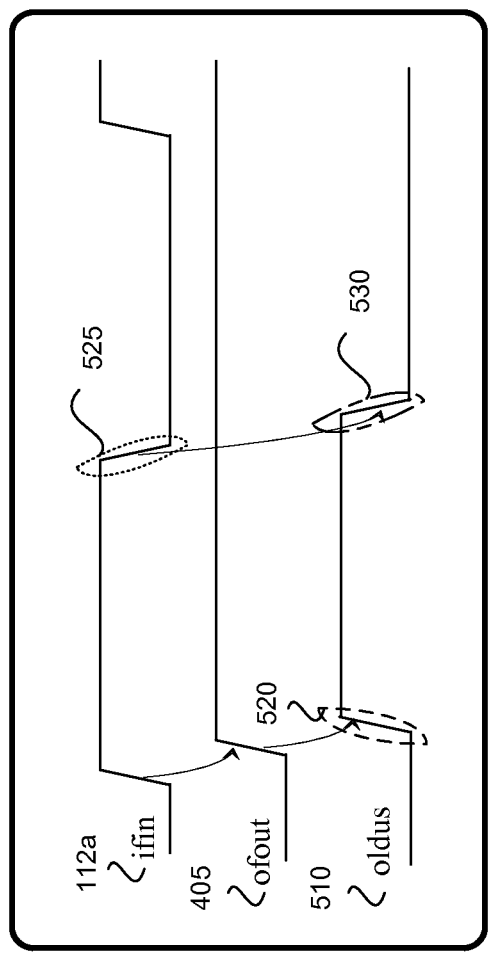
FIG. 5 is a waveform diagram that illustrates propagation of load pulse during a load event in accordance to an embodiment.

FIG. 5 is a waveform diagram that illustrates propagation of load pulse during a load event in accordance to an embodiment. Waveforms of critical reset pulses oldus 510 with reference to the element clocks ifin 112a and ofout 405. The oldus 510 during the rising edge 520 would cause can trigger a reset (or set) of latches in each element to ensure they are in the correct state. The next ifin 112a clock edge 525 can then be used to stop the reset 530 and the system can continue as normal.

Figure 6:
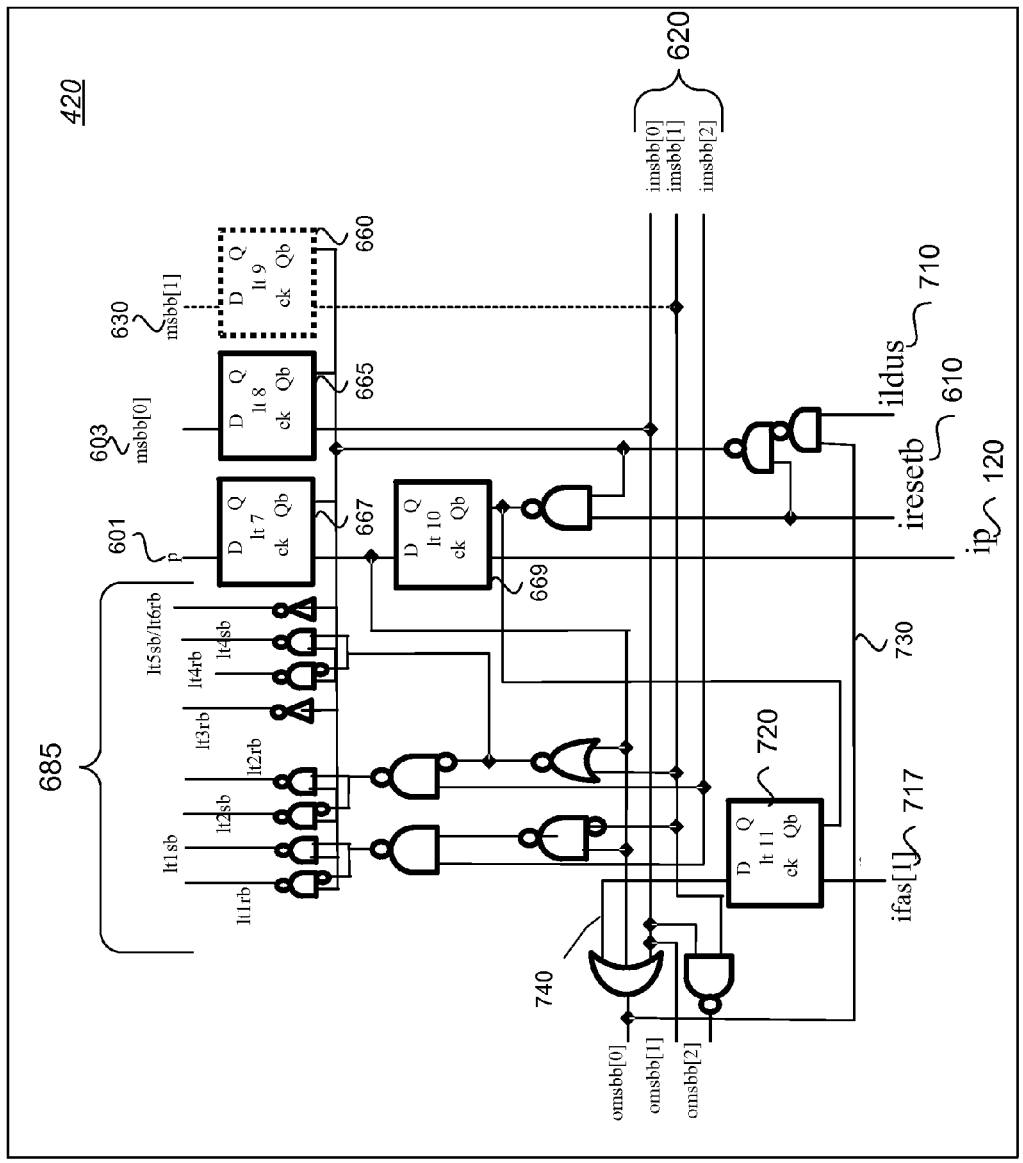
FIG. 6 is a block diagram of a pre-set decoder logic and divide code capture for non-least significant bits of the multi-modulus divider (MMD) in accordance to and embodiment.

FIG. 6 is a block diagram 420 of a pre-set decoder logic and divide code capture for non-least significant bits of the multi-modulus divider (MMD) in accordance to and embodiment. The generation of the local element reset pulses oldus 510 can be done via ofout 405. If iautld 407 is high then a rising edge on ofout 405 will initialize an oldus 510 pulse, which will be reset on the next falling edge of ifin 112a. If iautld 407 is high then the divider will automatically reload the current ip[n:0] 120 data and use it for the next count period. Note both a code of zero (0) or one (1) placed the divider into a divide by 1 mode, this ensures that if an erroneous code of zero (0) where to be loaded there would still be an ofout 405 signal to re-load the count value. To stop the divider the iresetb 610 pin should be held low. Note to save power only those elements that will be active in the next count will be loaded.

The decode logic needs to take the ip 120 data presented to it, along with information from its downstream element neighbor 620, and the local ildus 710 signal (oldus 510 at the individual divide element), and generate control signals to initialize the latches (660,665,667), pass data to its upstream neighbor, and capture the ip 120 data. From the live values on the ip 120 inputs to the divider elements combinatorial logic defines which latches (lt1-lt6) (see 210, 212, 214, 216, 282, and 284 at FIG. 2) will be set or reset on the next ildus 710 pulse. While not shown signals 685 are routed to the appropriate latches as indicated by arrow 432 in FIG. 4. When ildus 710 goes high either the lt$_n$rb or lt$_n$sb (shown above collectively as 685, where n is the latch number for the element) will go low thus resetting or setting the latches. Two latches lt7 667 and lt8 665 have been added to ensure the p 601, msbb [0] 603 values used by the rest of the circuit remain unchanged until the next load is request. Redundant latch 660 as msbb [1] 606 signal is the same as msbb[0] 603 of the adjacent downstream element.

Signal used to optionally speed up the msbb[0] 603 path which is used to define which divider stages are active (See discussion of imsbb [0] 297 at FIG. 2). If ifas 717 is low the identification of active stages is determined by a chain of OR gates 740, it is the prorogation of this signal to the lsb-stage (See FIG. 7) that can limit the initialization of the counter if a large number of stages are in the counter, and the previous count was small. The ifas 717 inputs (one per delay element in the chain of delay elements) can be applied at the same time as the ip 120 data to identify the active stage for this count, and so bypass the propagation delay of the OR chain (OR gates 740). If this stage is active then its ifas 717 input should be high. It should be noted that if ifas 717 is high when this stage is inactive the divider count will be wrong. Signal 730 is used to only allow ildus 710 pulse to unitize counter if this delay element is or below the MSB active element to save power.

It should be noted that when the iresetb 610 input is low all latches (720, 669, 667, 665, 660) become low, this allows live ip 120 data to propagate to the divider during a reset. When iresetb 610 input is high latch lt10 669 works in anti-phase to lt7 667 and lt8 665, and so captures the value of ip 120 on a rising edge of ildus 710. There is a slightly different version for the LSB element 410 such as OR gates 740 chain and latch lt11 720, where redundant upstream outputs (UPS 620) are removed and different latch presets are required.

Figure 7:
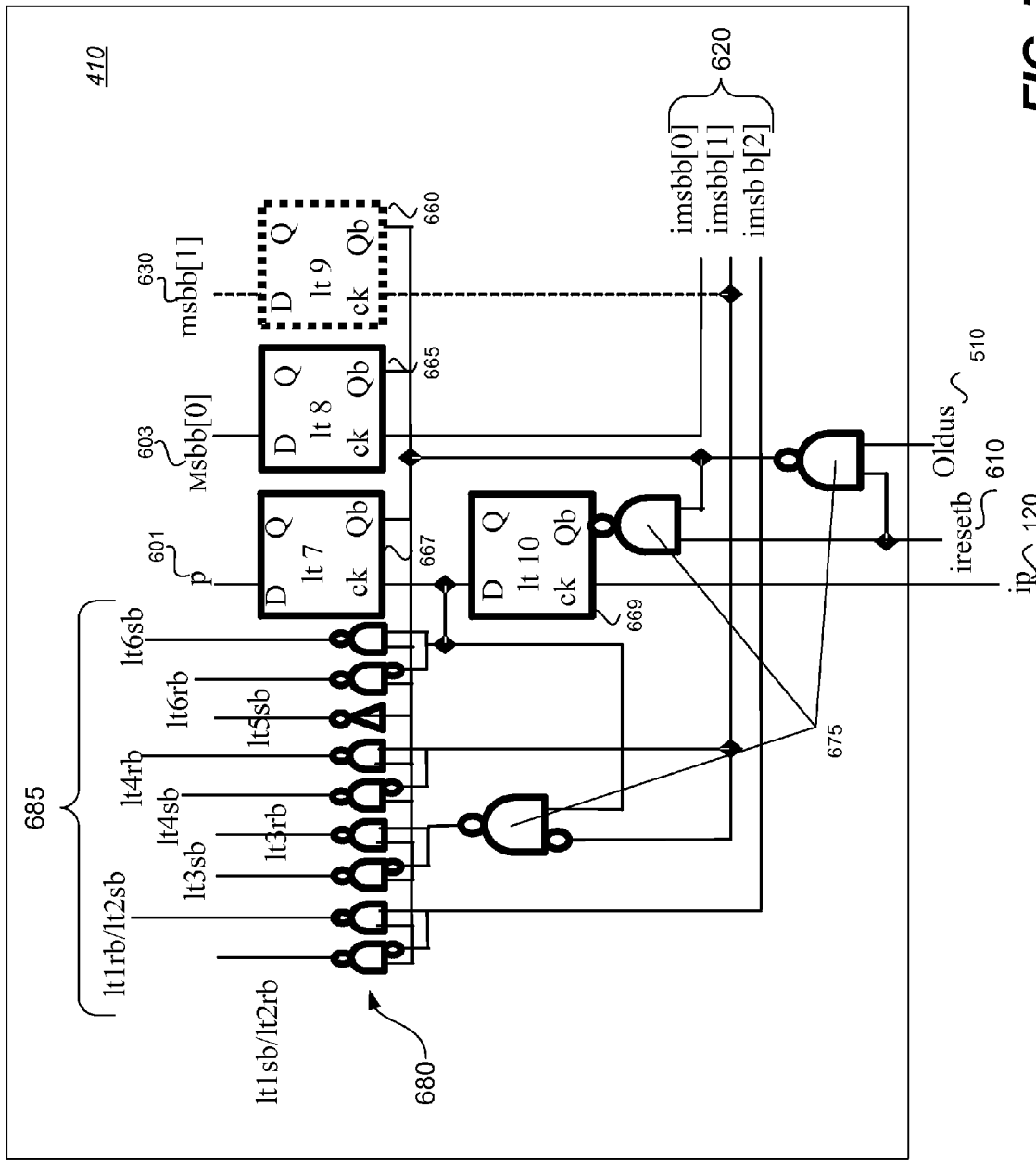
FIG. 7 is a block diagram of a pre-set decoder logic and divide code capture for a least significant bit of the multi-modulus divider (MMD) in accordance to and embodiment.

FIG. 7 is a block diagram of a pre-set decoder logic and divide code capture for a least significant bit of the multi-modulus divider (MMD) in accordance to and embodiment. Since pre-set decoder is part of the most upstream element the circuit that provided upstream output have been removed. When iresetb 610 is low all latches (669, 667, 665, 660) become low, this allows live ip 120 data to propagate to the divider during a reset. When iresetb 610 input is high latch lt10 669 works in anti-phase to lt7 667 and lt8 665, and so captures the value of ip 120 on a rising edge of ildus 710. NAND gates 675 and NAND gates 680 ensures these latches becomes transparent and are triggered at the correct time.

Figure 8:
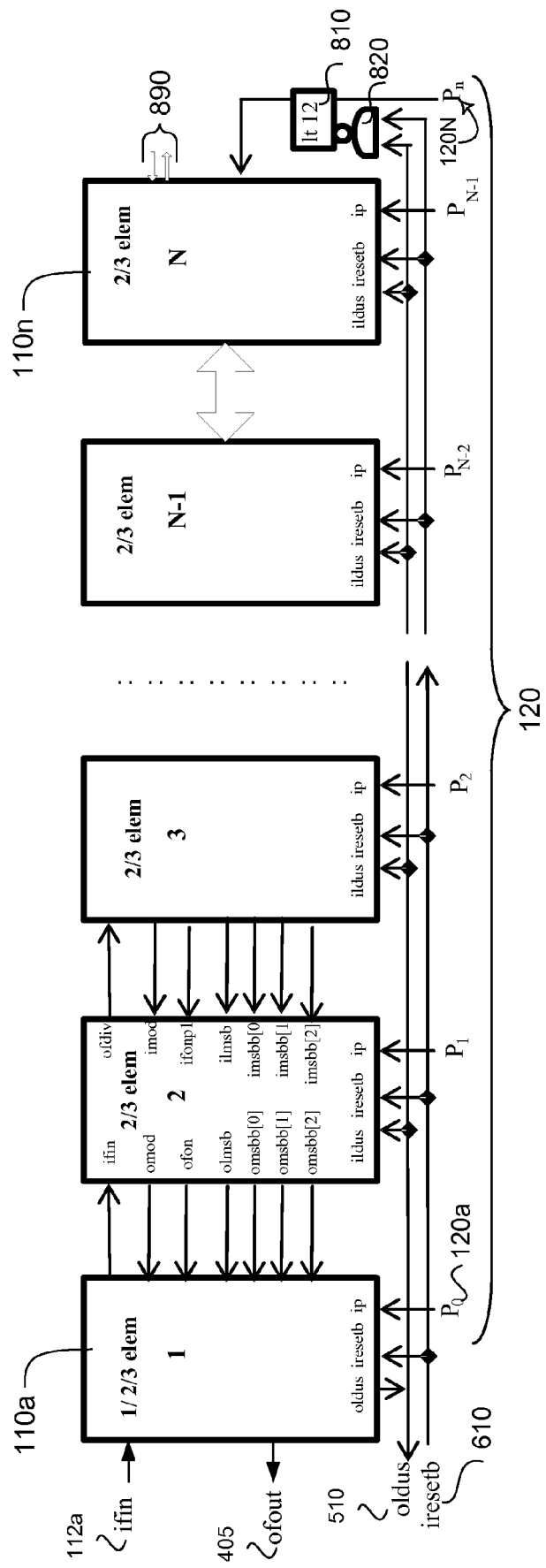
FIG. 8 illustrates a multi-modulus divider (MMD) with 50/50 output and initialization circuitry diagram in accordance to an embodiment.

FIG. 8 illustrates a multi-modulus divider (MMD) with 50/50 output and initialization circuitry diagram in accordance to an embodiment. Note the addition of latch lt12 810 is used to stop a change in Pn 120n (since at each element the P values are the ip 120 for that cell) affecting the divide code value during a load period. Also during a reset the NAND gate 820 on its clock input ensures this latch becomes transparent. The end-of-cycle logic block of the last divider cell N in the divider chain receives in addition a fixed end-of-cycle signal via a feedback input through I/O 890. The end-of-cycle logic block of all other divider cells receives in addition via a feedback input an end-of-cycle signal output, through I/O 890, by the end-of-cycle logic block of the respective next divider cell in the divider chain. There are some applications that require the resolution of the divide count go to half an ifin 112a clock period. The addition of an optional input clock (not shown) pre conditioner circuit element can be used upstream of the lsb element (delay elements N−1, N−2, . . . 1), to achieve higher clock resolution. This uses the normal divider ofout 405 signal to optionally modify the ifin 112a for the following ofout 405 period and pass the modified signal ofdiv 114a to the integer divider in such a way as to generate a total divide of count+(0.5 or 0). The wanted divider value is applied via the P[m:−1] 601 bus where P[m:0] define the integer divide value and P[−1] the state of the 0.5 divide element.

Embodiments within the scope of the present disclosure may also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures. When information is transferred or provided over a network or another communications connection (either hardwired, wireless, or combination thereof) to a computer, the computer properly views the connection as a computer-readable medium. Thus, any such connection is properly termed a computer-readable medium.

Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, objects, components, and data structures, etc. that performs particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Although the above description may contain specific details, they should not be construed as limiting the claims in any way. Other configurations of the described embodiments of the disclosure are part of the scope of this disclosure. For example, the principles of the disclosure may be applied to each individual user where each user may individually deploy such a system. This enables each user to utilize the benefits of the disclosure even if any one of the large number of possible applications do not need the functionality described herein. In other words, there may be multiple instances of the components each processing the content in various possible ways. It does not necessarily need to be one system used by all end users. Accordingly, the appended claims and their legal equivalents should only define the disclosure, rather than any specific examples given.

I claim:

1. A multi-modulus divider (MMD) comprising:
a chain of divide elements to generate a modulus control output synchronously with a clock signal in response to a modulus control input and a programming signal, the chain of divide elements having a plurality of states corresponding to a 2/3 divider; and
a duty cycle logic to generate the programming signal to a divide element in the chain of divide elements in response to a programming word for frequency division;
wherein the chain of divide elements are configurable as an N-stage or M-stage multi-modulus divider that divides an input signal and generates a frequency divider output signal;
wherein if a divide element in the chain of divide elements is a most significant active element, then it does not pass the clock signal downstream.

2. The multi-modulus divider (MMD) in accordance to claim 1, wherein the programming word is a binary programming value.

3. The multi-modulus divider (MMD) in accordance to claim 1, wherein if a divide element in the chain of divide elements is a most significant active element, then it selects a locally initialized path for the programming signal.

4. The multi-modulus divider (MMD) in accordance to claim 1, wherein if a divide element in the chain of divide elements is a most significant active element, then it selects a locally initialized path for the programming signal, else it selects a propagated re-timed path for the programming signal.

5. The multi-modulus divider (MMD) in accordance to claim 4, wherein each divide element incorporate a logic gate to prevent the divide element from generating a downstream output clock signal to a downstream divide element.

6. The multi-modulus divider (MMD) in accordance to claim 4, wherein the duty cycle logic at a least significant bit element of the chain of divide elements is programmed to generate the programming signal that is synchronized to a rising edge of an upstream input clock signal from an upstream divide element.

7. The multi-modulus divider (MMD) in accordance to claim 4, wherein the modulus control input is a modulus control signal that controls whether one of the chain of divide elements divides by two or divides by three.

8. A method comprising:
using a chain of divide elements to generate a modulus control output synchronously with a clock signal in response to a modulus control input and a programming signal, the chain of divide elements having a plurality of states corresponding to a 2/3 divider; and
using a duty cycle logic to generate the programming signal to a divide element in the chain of divide elements in response to a programming word for frequency division;
wherein the chain of divide elements are configurable as an N-stage or M-stage multi-modulus divider that divides an input signal and generates a frequency divider output signal;
wherein if a divide element in the chain of divide elements is a most significant active element, then it does not pass the clock signal downstream.

9. The method in accordance to claim 8, wherein the programming word is a binary programming value.

10. The method in accordance to claim 8, wherein if a divide element in the chain of divide elements is a most significant active element, then it selects a locally initialized path for the programming signal.

11. The method in accordance to claim 8, wherein if a divide element in the chain of divide elements is a most significant active element, then it selects a locally initialized path for the programming signal, else it selects a propagated re-timed path for the programming signal.

12. The method in accordance to claim 11, wherein each divide element incorporate a logic gate to prevent the divide element from generating a downstream output clock signal to a downstream divide element.

13. The method in accordance to claim 11, wherein the duty cycle logic at a least significant bit element of the chain of divide elements is programmed to generate the programming signal that is synchronized to a rising edge of an upstream input clock signal from an upstream divide element.

14. The method in accordance to claim 11, wherein the modulus control input is a modulus control signal that controls whether one of the chain of divide elements divides by two or divides by three.

15. A multi-modulus divider (MMD) comprising:
a chain of divide elements to generate a modulus control output synchronously with a clock signal in response to a modulus control input and a programming signal, the chain of divide elements having a plurality of states corresponding to a 2/3 divider;
a duty cycle logic to generate the programming signal to a divide element in the chain of divide elements in response to a programming word for frequency division; and
a decode logic at each divide element to trigger storage latches in the decode logic to a wait state in response to a divide value, wherein a storage latch stores the programming word for that divide element;

wherein the chain of divide elements are configurable as an N-stage or M-stage multi-modulus divider that divides an input signal and generates a frequency divider output signal.

16. The multi-modulus divider (MMD) in accordance to claim 15, wherein the programming word is a binary programming value.

17. The multi-modulus divider (MMD) in accordance to claim 16, wherein if a divide element in the chain of divide elements is a most significant active element, then it does not pass the clock signal downstream;
wherein if a divide element in the chain of divide elements is a most significant active element, then it selects a locally initialized path for the programming signal.

18. The multi-modulus divider (MMD) in accordance to claim 17, wherein if a divide element in the chain of divide elements is a most significant active element, then it selects a locally initialized path for the programming signal, else it selects a propagated re-timed path for the programming signal;
wherein each divide element incorporate a logic gate to prevent a divide element in the chain of divide elements from generating a downstream output clock signal to a downstream divide element;
wherein the duty cycle logic at a least significant bit element of the chain of divide elements is programmed to generate the programming signal that is synchronized to a rising edge of an upstream input clock signal from an upstream divide element;
wherein the modulus control input is a modulus control signal that controls whether one of the chain of divide elements divides by two or divides by three.

* * * * *